(12) United States Patent
Sugg et al.

(10) Patent No.: US 8,355,416 B2
(45) Date of Patent: Jan. 15, 2013

(54) WAVELENGTH STABILIZED MULTI-TRANSVERSE OPTICAL MODE LASER DIODES

(75) Inventors: Alan R. Sugg, Naperville, IL (US); Anthony L. Moretti, St. Charles, IL (US)

(73) Assignee: Vega Wave Systems, Inc., West Chicago, IL (US)

( * ) Notice: Subject to any disclaimer, the term of this patent is extended or adjusted under 35 U.S.C. 154(b) by 0 days.

(21) Appl. No.: 12/692,742

(22) Filed: Jan. 25, 2010

(65) Prior Publication Data

US 2010/0189149 A1 Jul. 29, 2010

Related U.S. Application Data

(60) Provisional application No. 61/146,684, filed on Jan. 23, 2009.

(51) Int. Cl.
*H01S 5/00* (2006.01)

(52) U.S. Cl. .............. 372/43.01; 372/45.01; 372/46.01; 372/64

(58) Field of Classification Search ............. 372/43.01, 372/45.01, 46.01
See application file for complete search history.

(56) References Cited

U.S. PATENT DOCUMENTS

| | | | |
|---|---|---|---|
| 4,608,697 A | 8/1986 | Coldren | |
| 4,896,325 A | 1/1990 | Coldren | |
| 5,262,360 A | 11/1993 | Holonyak, Jr. et al. | |
| 5,353,295 A * | 10/1994 | Holonyak et al. | 372/50.12 |
| 5,373,522 A | 12/1994 | Holonyak, Jr. et al. | |
| 5,567,980 A | 10/1996 | Holonyak, Jr. et al. | |
| 5,696,023 A | 12/1997 | Holonyak, Jr. et al. | |
| 6,628,686 B1 | 9/2003 | Sargent | |
| 7,408,966 B2 * | 8/2008 | Botez | 372/45.01 |
| 7,830,941 B2 | 11/2010 | Sugg et al. | |

OTHER PUBLICATIONS

Sugg, Alan R. et al., co-pending U.S. Appl. No. 12/895,976, filed Oct. 1, 2010 entitled "Wavelength Tunable Semiconductor Laser Having Multiple Sets of Intercavity Spacings" and having a common inventor and assignee with the present application.
Sugg, Alan R. et al., co-pending U.S. Appl. No. 12/895,971, filed Oct. 1, 2010 entitled "Method of Tuning a Semiconductor Laser Device Having Coupled Cavities" and having a common inventor and assignee with the present application.
L. A. Coldren and S. W. Corzine, Diode Lasers and Photonic Integrated Circuits, 1995, pp. 17-19, 366-367, John Wiley & Sons, Inc., United States.
Shun Lien Chuang, Physics of Optoelectronic Devices, 1995, pp. 252-255, 283, 294-297, John Wiley & Sons, Inc., United States.

* cited by examiner

*Primary Examiner* — Dung Nguyen
(74) *Attorney, Agent, or Firm* — Patzik, Frank & Samotny Ltd.

(57) ABSTRACT

A multi-transverse-optical-mode heterojunction diode laser characterized by wavelength control of its output. The wavelength control or the control of multi-transverse-optical-modes may be achieved by, for example, selectively etching a layer to partially remove it and possibly followed by epitaxial regrowth, or by selectively converting a layer to an insulating material of a different refractive index, or by selectively modifying the optical properties of a layer by ion implantation, or by selectively modifying the optical properties of a layer by impurity-induced vacancy disordering.

17 Claims, 11 Drawing Sheets

US 8,355,416 B2

WAVELENGTH STABILIZED MULTI-TRANSVERSE OPTICAL MODE LASER DIODES

CROSS-REFERENCES TO RELATED APPLICATIONS

This application claims priority to U.S. provisional application No. 61/146,684, filed on Jan. 23, 2009, the entirety of which is hereby incorporated by reference.

BACKGROUND OF THE INVENTION

1. Field of Invention

The present invention relates, in general, to lasers, and, specifically, to semiconductor lasers, including semiconductor lasers having wavelength control of their output.

2. Description of Related Art

Semiconductor lasers are commonly employed in a wide variety of applications, including computer networking, telecommunications, and numerous consumer electronics devices. Disclosures of prior art semiconductor lasers may be found, for example, in the following U.S. patents, the entirety of which are all hereby incorporated by reference: U.S. Pat. Nos. 4,896,325; 4,608,697; 5,353,295; 5,262,360; 5,696,023; 5,567,980; and 5,373,522.

BRIEF SUMMARY OF INVENTION

In an embodiment of the invention there is disclosed a semiconductor laser device that includes a semiconductor active region disposed between first and second semiconductor confining layers. An electrode array has electrode elements coupled with the first confining layer. [As used herein, the term "electrode elements" is intended to include electrical contact regions (e.g. highly doped semiconductor regions) that contact an underlying semiconductor structure.] At least one opposing electrode is coupled with the second confining layer. The electrode elements of the array are spaced apart and form a two-dimensional array that includes a plurality of electrode elements along a line and at least one further electrode element laterally spaced from the electrode element of said line. Means are provided for applying electrical signals between the electrode elements and the at least one further electrode element and the opposing electrode to effect light emission in the active regions defined under the plurality electrode elements and at least one active region defined under the at least one further electrode element, and to effect lateral coupling of the emissions.

A semiconductor active region is disposed between first and second semiconductor confining layers. The first and second semiconductor confining layers are of opposite conductivity type, with the semiconductor confining layer being of an aluminum-bearing III-V semiconductor material.

FIG. 18 shows a part of the surface of the device, and is used as a reference to show the cross-sections used for the illustrations of FIGS. 19-21. In FIG. 18 the stripe is labeled 1210 and the minicavities, or portions thereof, are labeled 1221-1225. The cross-section 19-19 is taken through the stripe 1210 and an adjacent minicavity 1224. The illustrated layers, which were previously described, include the bottom contact metallization 1250 (it being understood throughout that references to "bottom" or "top" are for ease of description, as the device may be mounted and used in any desired orientation), followed, in ascending order, by the n-type GaAs substrate layer 1255, the n-type GaAs buffer layer 1258, the n-type Al$_0$.23 Ga$_0$.77 As buffer layer 1260, the n-type Al$_0$.5 Ga$_0$.5 As lower confining layer 1263, and active region 1270 that includes a GaAs quantum well layer 1271 between waveguide layers 1273 and 1275 of undoped Al$_0$.23 Ga$_0$.77 As. Above the active region is the upper confining layer 1278 of p-type Al$_0$.8 Ga$_0$.2 As. The layer thicknesses may be, for example, as previously indicated above for the experimental device. The p-type GaAs contact 1281 and the p-type GaAs contact 1283 respectively define the contact positions of the stripe 1210 and the minicavity 1225 of FIG. 18.

The native oxide is shown at 1291, 1292, and 1293, and, in this example, has a thickness of about 1300 Å The oxide also extends somewhat under the GaAs contact regions. The top (p-side) metallization is labeled 1240.

The diagram of FIG. 20 illustrates the cross-section defined by arrows 20-20 of FIG. 18. In this view, only the contact region 1281 of the stripe 1210 is visible. The oxide (1294) extends continuously to the right of the stripe.

FIG. 21 shows the cross-section defined by arrows 21-21 of FIG. 182. This view is longitudinally through the minicavities, with two minicavities being shown between three oxide regions 1296, 1297, 1298. The longitudinal dimension of the contact 1283 is seen in this view.

A process, machine, manufacture, composition of matter, and improvement thereof, generally related to the field of semiconductor devices, the structure of diode lasers, and the structure of compound semiconductor heterojunction diode lasers. Illustratively, there can be an apparatus comprising, consisting essentially of, or consisting of (depending on application preference) a multi-transverse-optical-mode heterojunction diode laser characterized by wavelength control of its output. The wavelength control or the control of multi-transverse-optical-modes can be achieved by one of several methods, for example, by selectively etching a layer to partially remove it and possibly followed by epitaxial regrowth, or by selectively converting a layer to an insulating material of a different refractive index, or by selectively modifying the optical properties of a layer by ion implantation, or by selectively modifying the optical properties of a layer by impurity-induced vacancy disordering.

DETAILED DESCRIPTION OF INVENTION

Figure 1A:
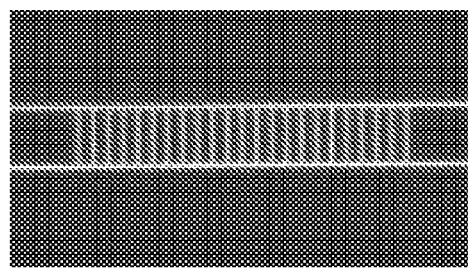
FIG. 1A is a photograph of a native-oxide-defined, 90 μm-broad-area, coupled-cavity laser diode.
Figure 1B:
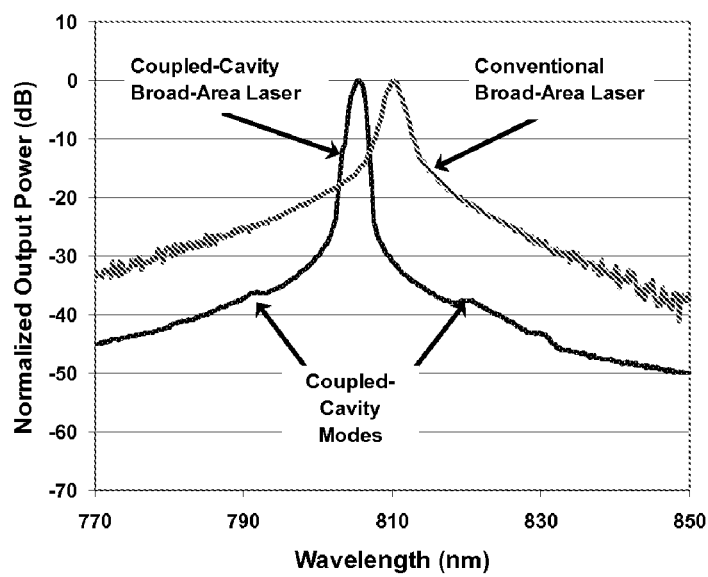
FIG. 1B is a graph of the normalized optical spectrum of a coupled-cavity diode laser compared to a conventional broad-area laser diode.

A photograph of an embodiment of the present invention is shown in FIG. 1A. The device is a high-power, oxide-defined, broad-area, coupled-cavity laser diode operating at 808 nm. In particular, the device is a native-oxide-defined, 90 μm-broad-area, coupled-cavity laser diode. Referring to FIG. 1B, the normalized optical spectrum of a coupled-cavity diode laser compared to a conventional broad-area laser diode. The two devices were fabricated from the same material and had the same stripe width. The coupled-cavity spectrum is shifted in wavelength, has a narrower linewidth and exhibits the resonances corresponding to the microcavities.

The present invention's approach to wavelength stabilization and increased power conversion efficiency is based in part upon several new features. These features include:
1. Native oxide process for broad-stripe definition—A planar, simple, low-cost manufacturing process with proven reliability from commercial vertical cavity surface-emitting laser (VCSEL) applications.
2. Longitudinal Optical Mode Stability—Native-oxide-defined coupled cavities exhibit wavelength stability and side-mode suppression similar to distributed feedback gratings and do not require epitaxial regrowth or high-resolution holographic or e-beam lithography.
3. Transverse mode control—Replacing the gain-guided broad area stripe conventionally used for high power lasers with an array of native-oxide-defined single-mode stripes will result in improved power conversion efficiency due to improved lateral overlap of the light and the pump current and less loss compared to gain-guided structures.

The native oxide can be used to stabilize both the longitudinal and transverse optical modes for high power performance and wavelength stability. One method of longitudinal optical modal stability with temperature is provided by a native-oxide-defined coupled-cavity configuration. The transverse optical modes may be stabilized using multiple native-oxide stripes. Transverse mode stability may or may not be necessary for wavelength control of the output power. The design of a device according to the present invention will now be described. The upper Al-bearing III-V semiconductor cladding layer provides optical mode confinement, and when oxidized is converted in to a low index of refraction material ideally suited to guiding optical modes. The amount of lateral optical confinement is dependent on the refractive index difference between the region where the light is guided versus the unguided region. The refractive index in the guided region depends upon the width of the guiding region and the depth of the native oxide. The design elements include:
1. Native oxide definition of microcavities.
   a. The cavity spacings necessary for wavelength selectivity at the desired operating wavelength.
   b. The oxide depth necessary for an effective index of refraction step.
2. The number of microcavities necessary for stable wavelength selection.
3. The stripe width for optimal power performance.

Cavities may also be realized using other methods, including impurity-induced vacancy layer disordering, etching (wet and dry), epitaxial regrowth, and ion implantation.

Figure 2:
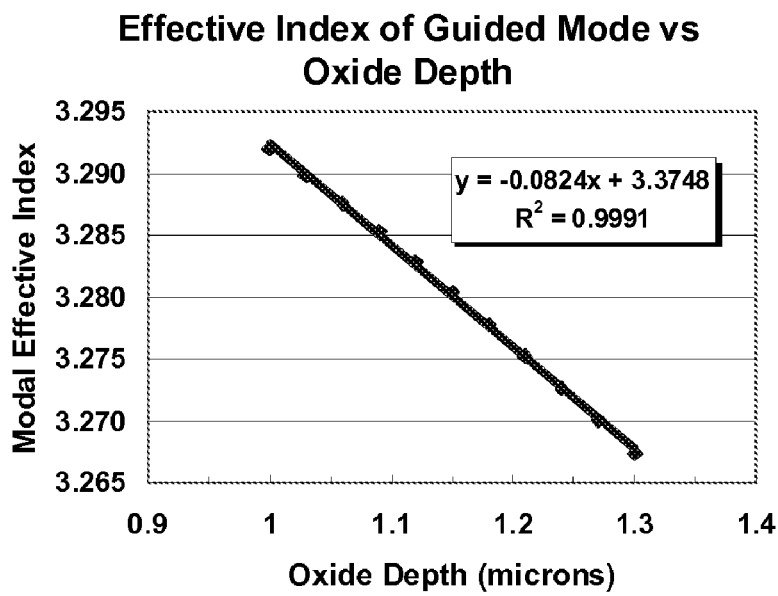
FIG. 2 is a graph of modeling data showing the effective index change versus oxide depth for a guided mode in a planar InAlGaAs-oxide waveguide.

By controlling the oxide depth in the ridge waveguide the effective index of the optical mode can be precisely controlled, as shown in the results of modeling performed on deep oxide waveguides. As can be seen in FIG. 2, a large effective index difference of 0.0165 can be achieved with an oxide thickness difference of 0.2 μm.

Referring to FIG. 2, modeling data shows the effective index change versus oxide depth for a guided mode in a planar InAlGaAs-oxide waveguide. The large effective index step of the grating can be precisely controlled using the depth of the oxide layer. The upper waveguide cladding region is 1.5 μm thick in this device design.

The present invention provides increased efficiency relative to optical losses from gain guiding. Conventional high power lasers utilize one or more gain-guided broad area stripes which are typically 100-200 μm wide. There is no lateral optical confinement for this type of structure. Thus, one would expect that it would not be as efficient as a laterally confined stripe. Spontaneous carrier recombination generates photons which traverse through the structure. For the gain-guided case, if the rays are at a shallow angle, they will make several passes through the stripe, resulting in significant amplification. For rays at larger angles the light leaves the stripe before reaching the facet where they are absorbed by the unpumped material, thereby resulting in lost energy and a lower conversion efficiency. In contrast, for laterally confined stripes, rays up to the critical angle for total internal reflection are laterally trapped within the stripe. These rays which would have been lost in the gain-guided case now are amplified and contribute to the output, thereby improving conversion efficiency.

Figure 3:
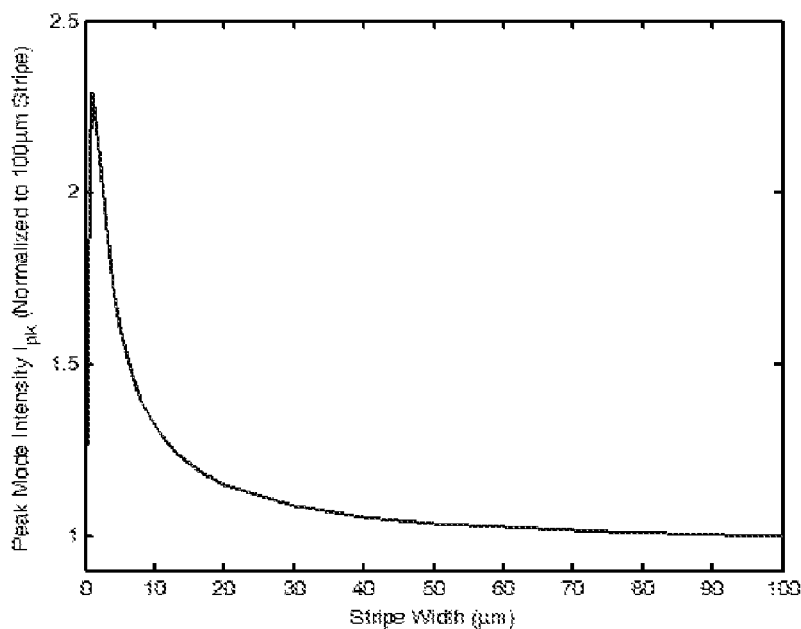
FIG. 3 is a graph of calculated peak modal intensity of a typical laser waveguide as a function of stripe width.

Optical mode confinement features of the present invention will now be described. Further improvements in efficiency may possibly be obtained by not only changing from a gain-guided stripe to a laterally optically confined stripe, but to segment the stripe into an array of individual uncoupled narrow stripes. This is because the efficiency η depends upon the stimulation rate $R_{st}$, which in turn depends upon the number of photons in the mode which is proportional to the optical mode intensity. Shown in FIG. 3 is a calculation of the peak modal intensity for the fundamental mode of a typical laser waveguide as a function of stripe width, normalized to the peak intensity of the mode for a 100 μm stripe. The peak modal intensity is defined to be the peak intensity value of the fundamental lateral mode normalized to the total power in the mode. Clearly, as the stripe width is reduced, the peak modal intensity increases, likely leading to increased efficiency η. This is one of the factors leading to higher reported optical efficiencies for single mode laser diodes relative to broad area multimode laser diodes.

Calculated peak modal intensity of a typical laser waveguide as a function of stripe width is shown in FIG. 3. The peak intensity increases as the stripe width decreases. Since the efficiency η is proportional to the peak modal intensity, it is expected that η will have the same shape and magnitude.

Figure 4:
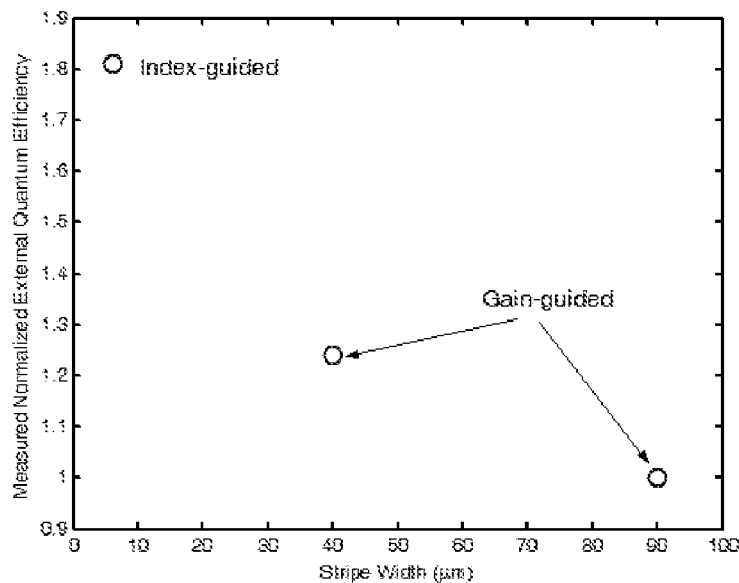
FIG. 4 is a graph of measured external quantum efficiency of gain-guided lasers (40 μm and 90 μm stripe width) and laterally confined laser (6 μm stripe width) fabricated from the same material.

As an example of the increased efficiency, preliminary measurements have been made comparing the efficiencies of single mode and multimode laser diodes operating at 808 nm. Samples were fabricated from the same material with gain-guided stripe widths of 40 μm and 90 μm and for a laterally index-confined stripe of 6 μm width. Plotted in FIG. 4 is the external quantum efficiency η (normalized to the efficiency of a 100 μm stripe) as a function of stripe width. As can be seen, η increases with decreasing stripe width and moving from gain-guided wider stripes to laterally confined stripes.

Referring to FIG. 4, measured external quantum efficiency of gain-guided lasers (40 μm and 90 μm stripe width) and laterally confined laser (6 μm stripe width) fabricated from the same material are shown. Efficiency improves when (1) moving from gain-guided to laterally confined stripes and (2) when stripe width decreases so that the peak modal intensity increases. The efficiencies are normalized to the 90 μm stripe efficiency.

Thus, a deep native oxide of the Al-bearing material may be used to define the stripe array. An example of this is shown in FIG. 5.

Figure 5:
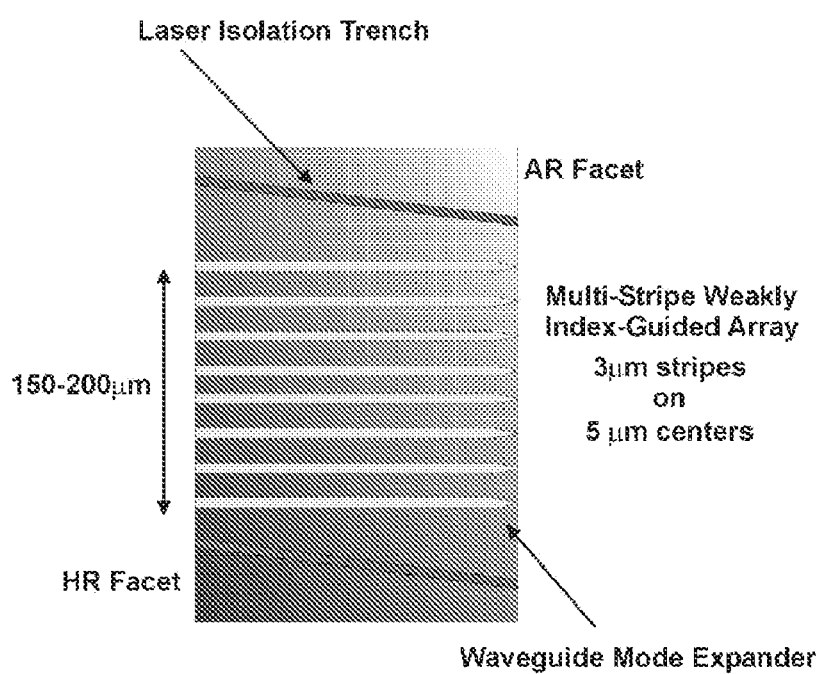
FIG. 5 is simplified diagram of native-oxide-defined multi-stripe array geometry for one element of the high-power array.

Referring to FIG. 5, the native-oxide-defined multi-stripe array geometry for one element of the high-power array is shown. The stripes are defined by the native oxide, which serves to define the current aperture as well as guide the optical modes to increase the lateral optical confinement.

In addition to defining the stripe array, the native oxide can be used to expand the optical mode at the output of the array. A combination of wet etch and oxidation is used to push the optical mode out of the waveguide at the emitting facet. This serves to expand the optical mode, reducing the power density and the absorption at the facet, increasing the reliability of the device. Alternative methods of reducing the absorption at the facet include fabricating a window near the output facet that is not pumped by current and whereby the quantum wells in the active region have their absorption peak moved to shorter wavelength (higher energy) so as to not absorb the optical power of the laser. This can be achieved by methods such as impurity-induced disordering or vacancy-induced disordering. Another possibility includes pushing the optical mode into a parallel vertical waveguide that does not contain the absorbing quantum wells.

Device fabrication will now be addressed. Regarding oxide device fabrication, oxide devices have the advantage of a relatively simple fabrication procedure. Standard semiconductor device fabrication techniques will be used to process the laser diode. An outline of typical processing steps for an oxide-based device is shown below:

1. Surface preparation and clean.
2. Plasma enhanced chemical vapor deposition (PECVD) 1200 Å of $SiN_x$.
3. Photolithography for stripe or mesa definition.
4. Plasma etch $SiN_x$.
5. Photoresist removal.
6. Wet etch of GaAs cap (1:8:80, $H_2SO_4:H_2O_2:H_2O$).
7. Oxidation of exposed AlGaAs
8. Dry etch to remove $SiN_x$.
9. Broad-area metalization for p-contact definition.
10. Bar cleaving and optical facet coating.

To improve power and efficiency, the laser diode facets may be coated with a combination of high reflectance and ant-reflectance optical coatings. Also, a thick (>0.5 μm) Au metal layer on the p-side may be used to assist the heat-spreading over the anode.

Figure 6:
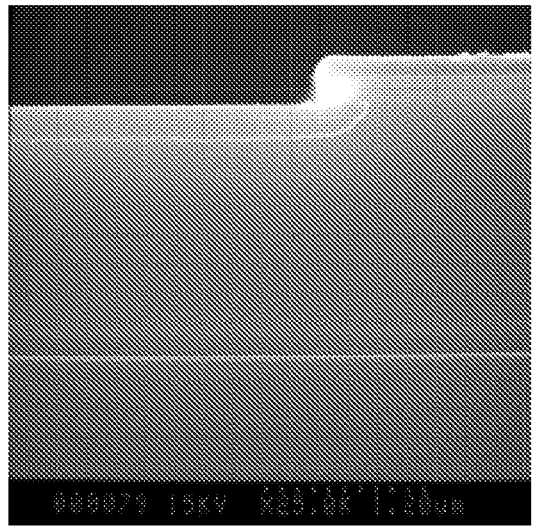
FIG. 6 is a SEM micrograph of a waveguide edge of a planar InAlAs-oxide-defined laser diode.
Figure 7:
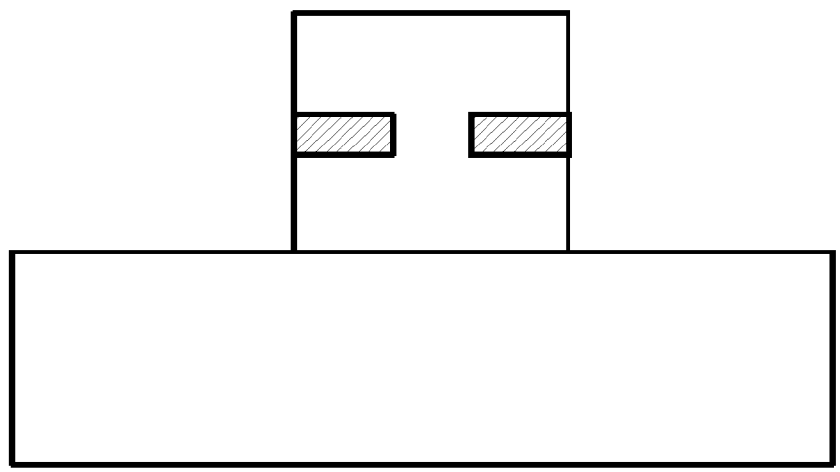
FIG. 7 is a simplified diagram of a cross section of a lateral oxidation combined with wet or dry etching.

Oxidations in device fabrication will not be addressed. Typically, vertical oxidation is used to provide the lateral stripe definition and the CCL cavities. FIG. 6 shows a scanning electron microscope image of a typical vertical oxidation of InAlAs. Alternatively, lateral oxidation combined with either wet or dry etching can be used (as shown in FIG. 7). Additionally, the optical variation obtained with oxidation can be replaced with either wet or dry etching. These processes are less desirable than oxidation. Reasons include the fact that etching results in non-planar processing, is generally less controllable (etch depth versus oxidation depth), do not provide electrical isolation between deposited metals and etched regions of the semiconductor without additional processing steps of adding dielectrics and performing photolithography. None-the-less, it is still possible to fabricate laterally confined, CCL-stabilized devices.

FIG. 6 shows a SEM micrograph of the waveguide edge of the planar InAlAs-oxide-defined laser diode. FIG. 7 shows a diagram of the cross section of a lateral oxidation combined with wet or dry etching. Various configurations for high power semiconductor lasers of the present invention shown in FIGS. 8-17 providing stripe definition, lateral mode stability, and transverse mode confinement.

Figure 8:
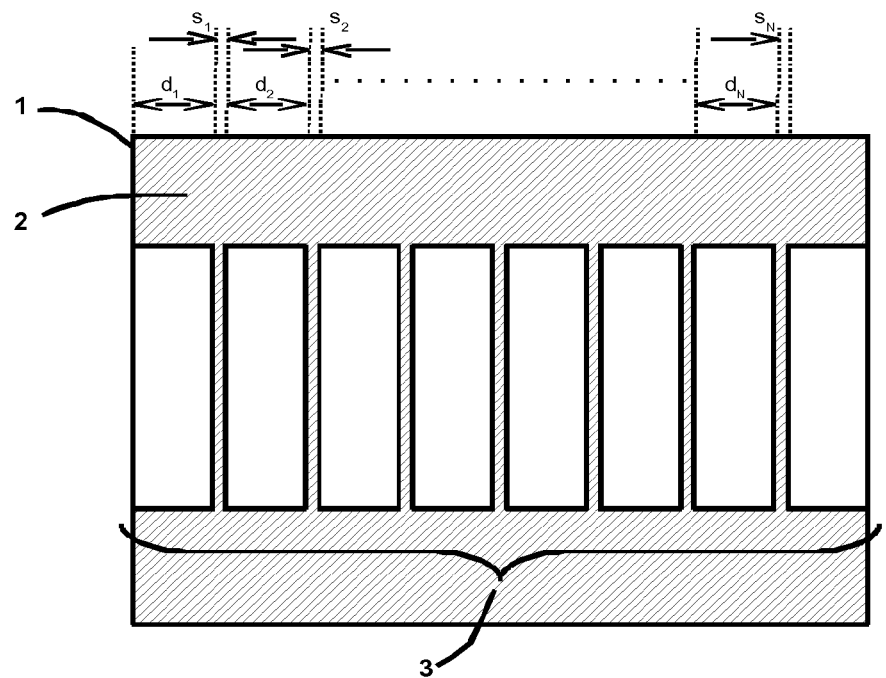
FIG. 8 is a simplified diagram of a broad stripe high power laser with wavelength control.

A top view of a broad stripe high power laser with wavelength control (1) is shown in FIG. 8. The native oxide (2) forms a series of coupled cavities (3), the periodicity d+s of which provides the wavelength stability. For constant d and constant s, the wavelength control is very sharp. In contrast, the wavelength control can be controlled by varying $d_1$, $d_2$, ... $d_N$ and/or $s_1$, $s_2$, ... $s_N$.

Figure 9:
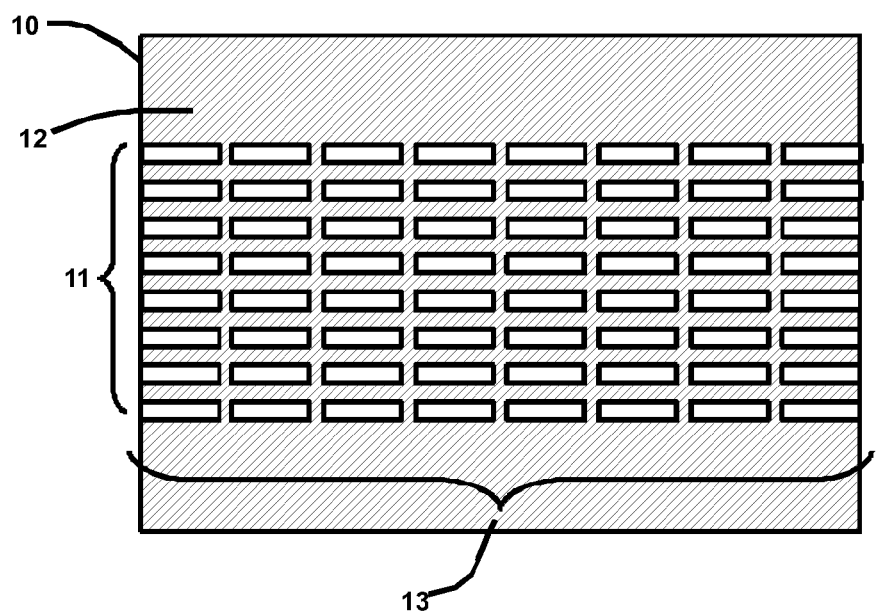
FIG. 9 is a simplified diagram of an embodiment of the invention having an array of narrow stripes.

A further embodiment showing the high power laser (10) with an array of narrow stripes (11) is shown in FIG. 9. Again, the native oxide (12) forms a series of coupled cavities (13), the periodicity or pattern of which provides the wavelength stability.

Figure 10:
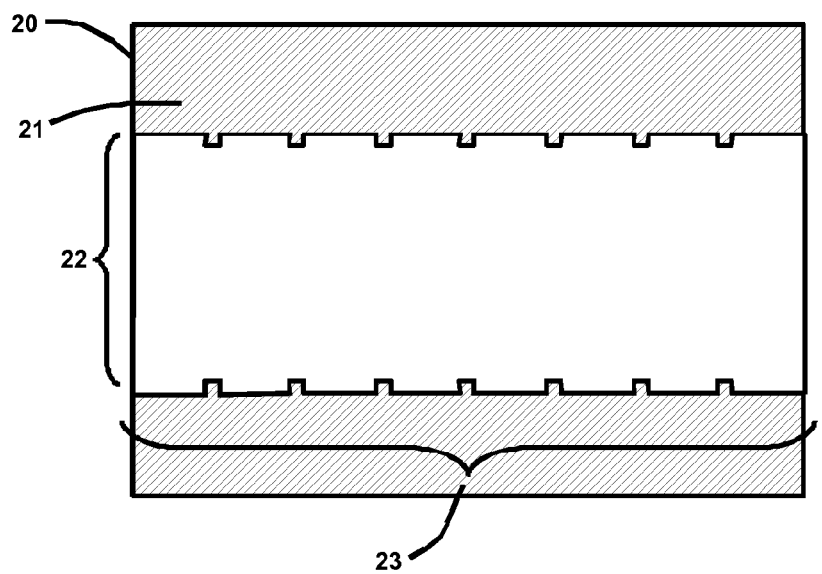
FIG. 10 is a simplified diagram of an embodiment of the invention having a periodically modulated width of a broad area stripe with a pattern having a periodicity relationship as indicated in FIG. 8.

As shown in FIG. 10, a further embodiment of the high power laser (20) defined by native oxide (21) may also be obtained by periodically modulating the width of the broad area stripe (22) with a pattern (23) with the periodicity relationship as outlined in FIG. 8.

Figure 11:
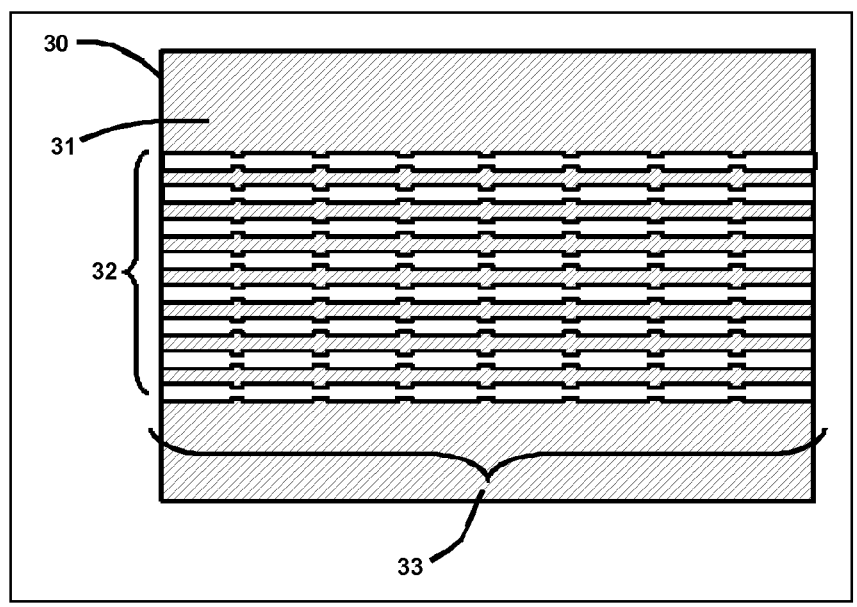
FIG. 11 is a simplified diagram of an embodiment of the invention having a periodically modulated width of each stripe with a pattern having a periodicity relationship as indicated in FIG. 9.

As shown in FIG. 11, a further embodiment of the high power laser (30) defined by native oxide (31) may also be obtained by periodically modulating the width of each stripe (32) with a pattern (33) with the periodicity relationship as outlined in FIG. 9.

Figure 12:
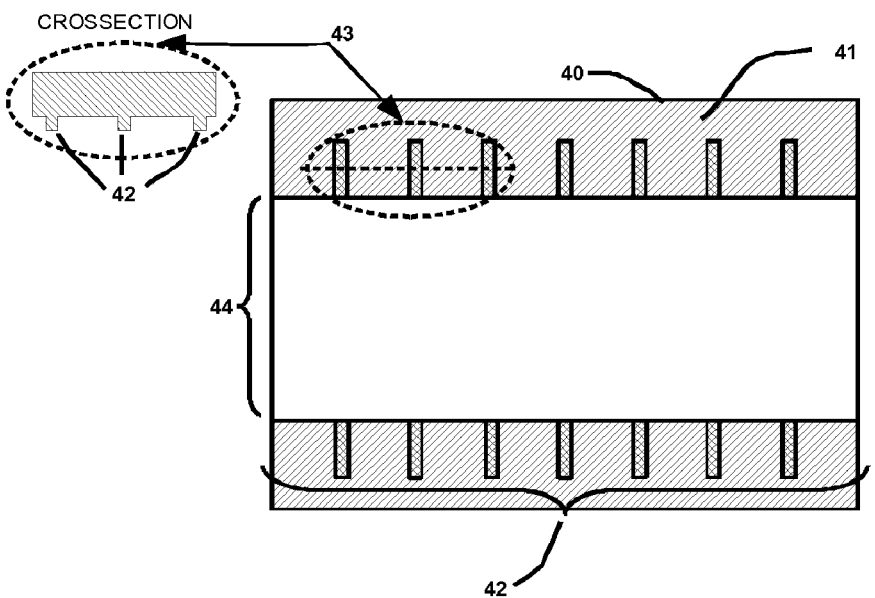
FIG. 12 is a simplified diagram of an embodiment of the invention having a periodically modulated native oxide depth as shown in a cross-section at the boundary of the broad area stripe with a pattern or periodicity relationship as indicated in FIG. 9.

As shown in FIG. 12, a further embodiment of the high power laser (40) defined by native oxide (41) may also be obtained by periodically modulating the native oxide depth (42) as shown in the cross-section (43) at the boundary of the broad area stripe (44) with the same pattern or periodicity relationship as outlined in FIG. 8.

Figure 13:
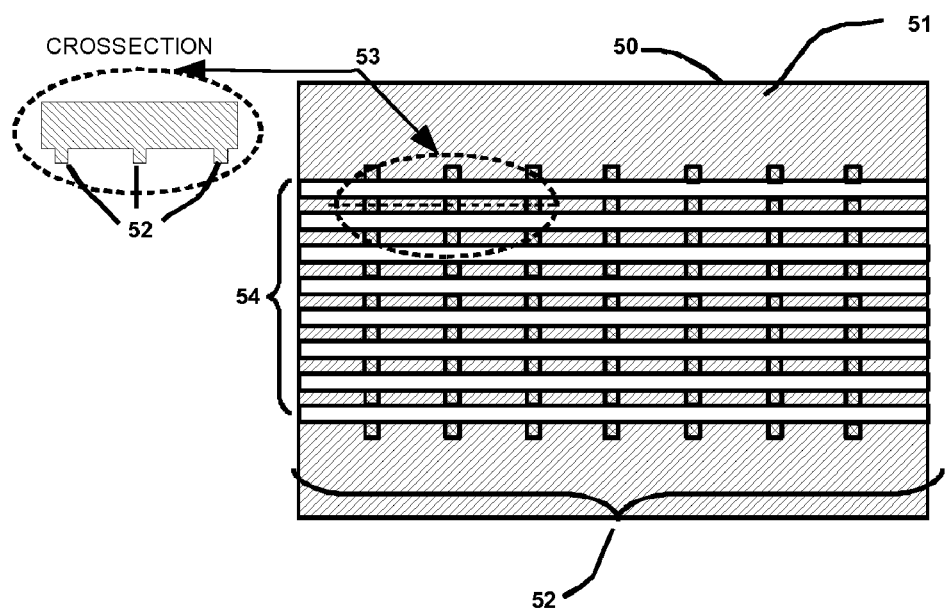
FIG. 13 is a simplified diagram of an embodiment of the invention having a periodically modulated native oxide depth as shown in a cross-section at the boundary of each stripe with the same pattern or periodicity relationship as indicated in FIG. 9.

As shown in FIG. 13, a further embodiment of the high power laser (50) defined by native oxide (51) may also be obtained by periodically modulating the native oxide depth (52) as shown in the cross-section (53) at the boundary of each stripe (54) with the same pattern or periodicity relationship as outlined in FIG. 9.

Figure 14:
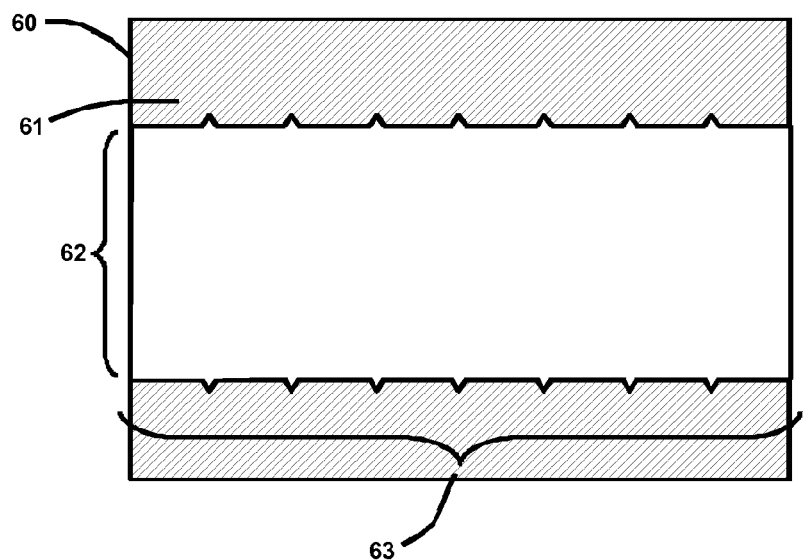
FIG. 14 is a simplified diagram of an embodiment of the invention having a periodically modulated width of the broad area stripe using non-rectangular shaped geometries.

As shown in FIG. 14, a further embodiment of the high power laser (60) defined by native oxide (61) may also be obtained by periodically modulating the width of the broad area stripe (62) with non-rectangular shaped geometries (63).

Figure 15:
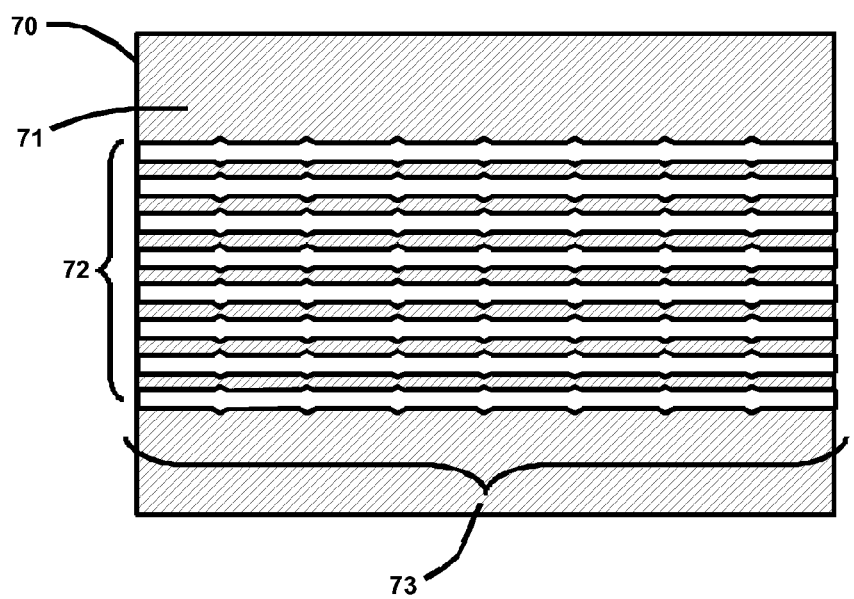
FIG. 15 is a simplified diagram of an embodiment of the invention having a periodically modulated width of an array of stripes, each with non-rectangular shaped geometries.

As shown in FIG. 15, a further embodiment of the high power laser (70) defined by native oxide (71) may also be obtained by periodically modulating the width of the array of stripes (72) with non-rectangular shaped geometries (73).

Figure 16:
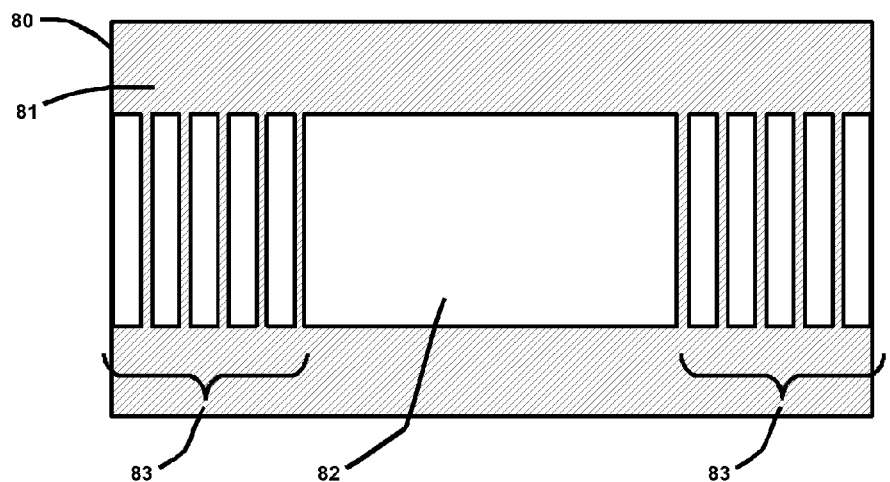
FIG. 16 is a simplified diagram of an embodiment of the invention wherein the broad stripe is surrounded by opposing sets of multiple coupled-cavity regions.

As shown in FIG. 16, a further embodiment of the high power laser (80) defined by native oxide (81) may also be obtained by surrounding a broad stripe (82) using multiple coupled-cavity regions (83) and (84). The regions (83) and (84) may have separate metal contacts in order to further control or tune the output wavelength.

Figure 17:
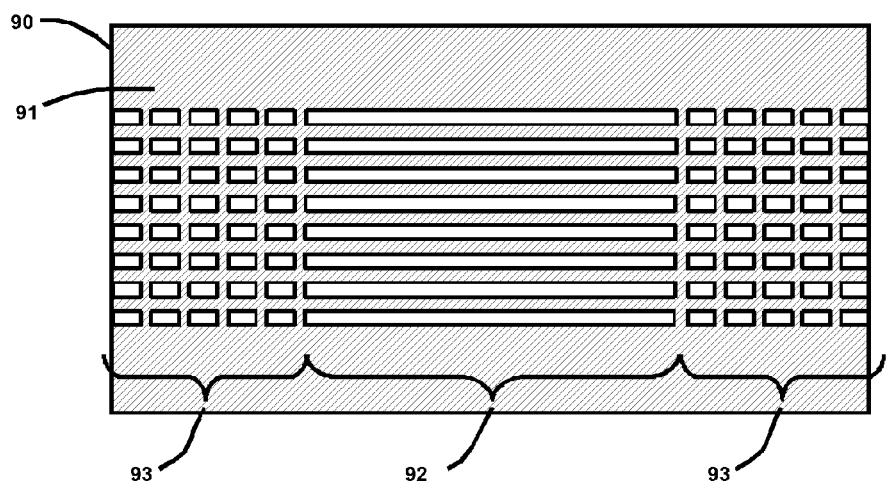
FIG. 17 is a simplified diagram of an embodiment of the invention wherein an array of stripes is surrounded by opposing sets of multiple coupled-cavity regions.
Figure 18:
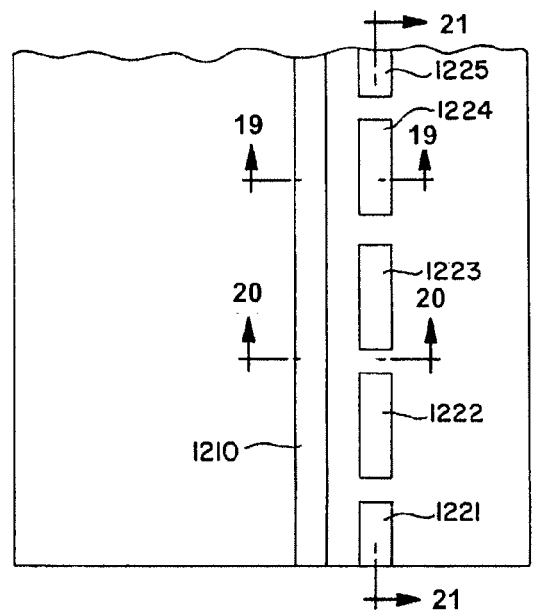
FIG. 18 is diagram of a portion of the top surface of a semiconductor laser device.
Figure 19:
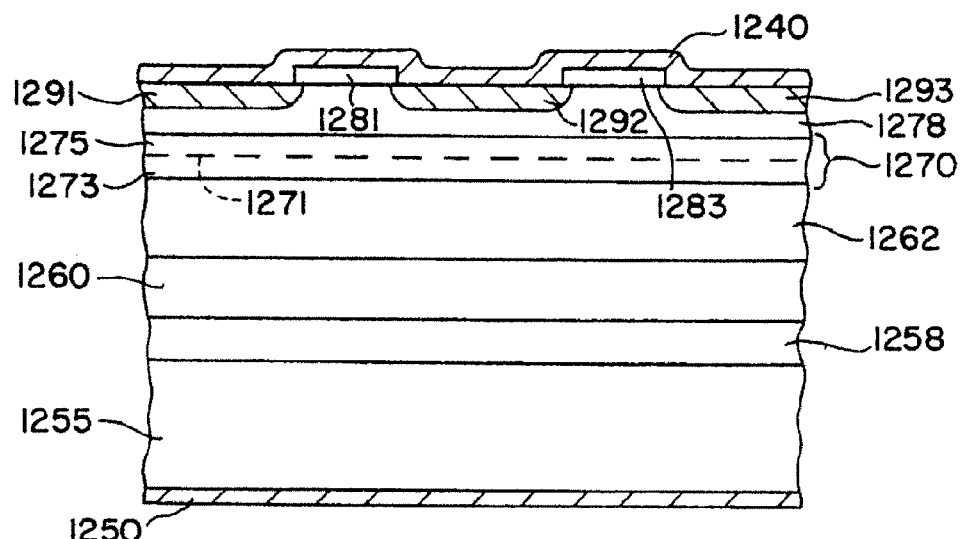
FIG. 19 is a cross-sectional diagram (not to scale) of the device of FIG. 18, taken generally along lines 19-19 of FIG. 18.
Figure 20:
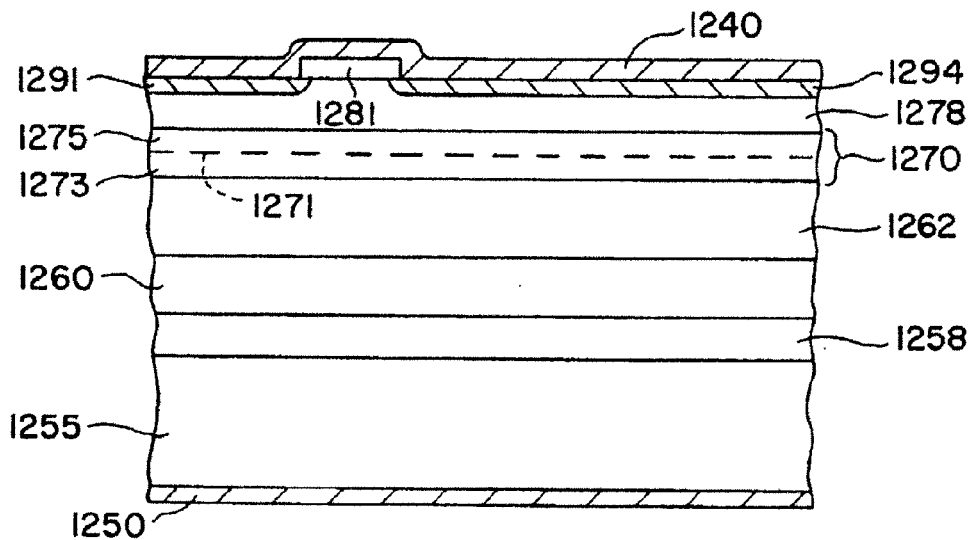
FIG. 20 is a cross-sectional diagram (not to scale, of the device of FIG. 18, taken generally along lines 20-20 of FIG. 18.
Figure 21:
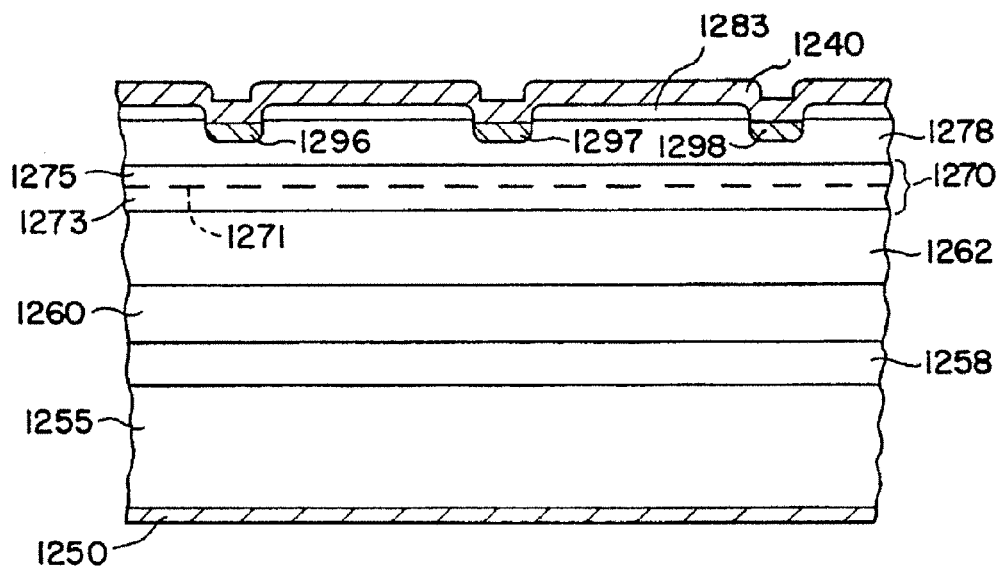
FIG. 21 is a cross-sectional diagram (not to scale) of the device of FIG. 18, taken generally along lines 21-21 of FIG. 18.

As shown in FIG. 17, a further embodiment of the high power laser (90) defined by native oxide (91) may also be obtained by surrounding an array of stripes (92) using multiple coupled-cavity regions (93) and (94). The regions (93) and (94) may have separate metal contacts in order to further control or tune the output wavelength.

It will be understood that modifications and variations may be effected without departing from the spirit and scope of the present invention. It will be appreciated that the present disclosure is intended as an exemplification of the invention and is not intended to limit the invention to the specific embodiment illustrated and described. The disclosure is intended to cover, by the appended claims, all such modifications as fall within the scope of the claims.

What is claimed is:

1. A semiconductor laser device, comprising:
   a semiconductor active region disposed between at least one first and at least one second semiconductor confining layer, said at least one first semiconductor confining layer and said at least one second semiconductor confining layer being of opposite conductivity type; and
   one or more laterally confined optical waveguides where each waveguide is comprised of a plurality of regions with different lateral optical confinement.

2. The invention according to claim 1, wherein said plurality of regions with different lateral optical confinement comprises regular periodic lateral confinement regions.

3. The invention according to claim 1, wherein said at least one first semiconductor confining layer comprises an aluminum-bearing III-V semiconductor material; and
   an oxide of said aluminum-bearing III-V semiconductor material is formed in at least a portion of said at least one first confining layer, said oxide substantially surrounding said plurality of regions with different lateral optical confinement, said lateral confinement regions being arranged in a periodic serial sequence along each said laterally confined optical waveguide.

4. The invention according to claim 1, further comprising an etched region formed in at least a portion of said at least one first semiconductor confining layer, said etched region forming said plurality of regions with different lateral optical confinement, said lateral confinement regions being arranged in a periodic serial sequence along each said laterally confined optical waveguide.

5. The invention according to claim 1, wherein said plurality of regions with different lateral optical confinement comprises a different semiconductor material in at least a portion of at least one of said semiconductor active region, said at least one first semiconductor confining layer, and said at least one second semiconductor confining layer, said different semiconductor material forming said plurality of regions with different lateral optical confinement, said lateral confinement regions being arranged in a periodic serial sequence along each said laterally confined optical waveguide.

6. The invention according to claim 1, further comprising an impurity-induced layer-disordered region formed in at least one of said semiconductor active region, said at least one first semiconductor confining layer, or and said at least one second semiconductor confining layer, said impurity-induced layer-disordered region forming said plurality of regions with different lateral optical confinement, said lateral confinement regions being arranged in a periodic serial sequence along each said laterally confined optical waveguide.

7. The invention according to claim 1, wherein said plurality of regions with different lateral optical confinement comprises a dielectric material in at least a portion of at least one of said semiconductor active region, said at least one first semiconductor confining layer, and said at least one second semiconductor confining layer, said dielectric material forming said plurality of regions with different lateral optical confinement, said lateral confinement regions being arranged in a periodic serial sequence along each said laterally confined optical waveguide.

8. The invention according to claim 1, wherein said plurality of regions with different lateral optical confinement comprises regular aperiodic lateral confinement regions.

9. The invention according to claim 1, wherein said at least one first semiconductor confining layer comprises an aluminum-bearing III-V semiconductor material; and
   an oxide of said aluminum-bearing III-V semiconductor material is formed in at least a portion of said at least one first semiconductor confining layer, said oxide substantially surrounding said plurality of regions with different lateral optical confinement, said lateral confinement regions being arranged in an aperiodic serial sequence along each of said laterally confined optical waveguides.

10. The invention according to claim 1, further comprising an etched region formed in at least a portion of said at least one first semiconductor confining layer, said etched region forming said plurality of regions with different lateral optical confinement, said lateral confinement regions being arranged in an aperiodic serial sequence along each of said laterally confined optical waveguides.

11. The invention according to claim 1, wherein said plurality of regions with different lateral optical confinement comprises a different semiconductor material in at least a portion of at least one of said active region, said at least one first semiconductor confining layer, and said at least one second semiconductor confining layer, said different semiconductor material forming said plurality of regions with different lateral optical confinement, said lateral confinement regions being arranged in an aperiodic serial sequence along each of said laterally confined optical waveguide.

12. The invention according to claim 1, further comprising an impurity-induced layer-disordered region formed in at least one of said semiconductor active region, said at least one first semiconductor confining layer, and said at least one second semiconductor confining layer, said impurity-induced layer-disordered region forming said plurality of regions with different lateral optical confinement, said lateral confinement regions being arranged in an aperiodic serial sequence along each of said laterally confined optical waveguides.

13. The invention according to claim 1, wherein said plurality of regions with different lateral optical confinement comprises a dielectric material in at least a portion of at least one of said active region, said at least one first semiconductor confining layer, and said at least one second semiconductor confining layer, said dielectric material forming said plurality of regions with different lateral optical confinement, said lateral confinement regions being arranged in an aperiodic serial sequence along each of said laterally confined optical waveguides.

14. The invention according to claim 1, wherein the semiconductor active region does not include an active photonic crystal structure.

15. The invention according to claim 1, wherein the semiconductor active region does not include a modulated optical gain.

16. The invention according to claim 1, wherein each of the one or more laterally confided optical waveguides has a direction of optical propagation, and the plurality of regions with different lateral optical confinement are arranged along the direction of optical propagation.

17. The invention according to claim 1, wherein each of the one or more laterally confided optical waveguides has a direction of optical propagation, and the plurality of regions with different lateral optical confinement differ relative to each other along the direction of optical propagation.

* * * * *